(12) United States Patent
Jeong et al.

(10) Patent No.: US 10,325,971 B2
(45) Date of Patent: Jun. 18, 2019

(54) DISPLAY DEVICE INCLUDING A FIRST CAPACITOR ELECTRODE AND A SECOND CAPACITOR ELECTRODE

(71) Applicant: SAMSUNG DISPLAY CO., LTD., Yongin-si, Gyeonggi-do (KR)

(72) Inventors: Cheol Yun Jeong, Yongin-si (KR); Hee June Kwak, Yongin-si (KR); Ju Ae Youn, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/722,619

(22) Filed: Oct. 2, 2017

(65) Prior Publication Data

US 2018/0102398 A1    Apr. 12, 2018

(30) Foreign Application Priority Data

Oct. 6, 2016    (KR) .................. 10-2016-0129069

(51) Int. Cl.
*H01L 27/32* (2006.01)
*H01L 33/40* (2010.01)
(Continued)

(52) U.S. Cl.
CPC .... *H01L 27/3248* (2013.01); *G02F 1/136213* (2013.01); *H01L 27/3258* (2013.01); *H01L 27/3265* (2013.01); *H01L 27/3276* (2013.01); *H01L 28/88* (2013.01); *H01L 28/90* (2013.01); *H01L 29/78696* (2013.01); *H01L 33/40* (2013.01); *H01L 33/42* (2013.01); *H01L 51/5212* (2013.01); *H01L 51/56* (2013.01); *H01L 2227/323* (2013.01)

(58) Field of Classification Search
CPC ............ H01L 27/3248; H01L 27/3258; H01L 27/3265; H01L 28/82; H01L 28/90
USPC ......................................... 257/40, 59, 71, 72
See application file for complete search history.

(56) References Cited

U.S. PATENT DOCUMENTS 9,035,311 B2    5/2015   Park et al.
9,153,633 B2    10/2015  You
(Continued)

FOREIGN PATENT DOCUMENTS

KR    1020040108276    12/2004
KR    1020080078164    8/2008

*Primary Examiner* — Matthew E Warren
(74) *Attorney, Agent, or Firm* — F. Chau & Associates, LLC

(57) ABSTRACT

A display device includes a substrate, a semiconductor layer on the substrate, a gate insulating layer on the semiconductor layer and having one or more first openings, a gate electrode on the gate insulating layer, a first capacitor electrode on the gate insulating layer, a first interlayer insulating layer on the first capacitor electrode and having one or more second openings, a second capacitor electrode on the first interlayer insulating layer, a source electrode and a drain electrode connected with the semiconductor layer, and a light emitting diode connected with the drain electrode. The first capacitor electrode includes one or more protrusions in the first openings of the gate insulating layer and correspond to a shape of the first openings, and the second capacitor electrode includes one or more protrusions in the second openings of the first interlayer insulating layer and correspond to a shape of the second openings.

20 Claims, 10 Drawing Sheets

(51) Int. Cl.
*H01L 33/42* (2010.01)
*H01L 49/02* (2006.01)
*G02F 1/1362* (2006.01)
*H01L 29/786* (2006.01)
*H01L 51/52* (2006.01)
*H01L 51/56* (2006.01)

(56) References Cited

U.S. PATENT DOCUMENTS

| | | |
|---|---|---|
| 9,202,852 B2 | 12/2015 | Kwak |
| 9,293,522 B2 | 3/2016 | Wang et al. |
| 9,373,670 B2 | 6/2016 | Tae |
| 2006/0091399 A1* | 5/2006 | Lee .................. H01L 27/12 257/72 |
| 2006/0164359 A1* | 7/2006 | Kimura ............... G09G 3/2014 345/92 |
| 2008/0067519 A1* | 3/2008 | Sakurai ............ G02F 1/136213 257/72 |
| 2008/0206911 A1 | 8/2008 | Park et al. |
| 2009/0166637 A1* | 7/2009 | Park .................. H01L 27/1255 257/71 |
| 2010/0224881 A1* | 9/2010 | Park .................. H01L 27/3265 257/71 |

* cited by examiner

DISPLAY DEVICE INCLUDING A FIRST CAPACITOR ELECTRODE AND A SECOND CAPACITOR ELECTRODE

CROSS-REFERENCE TO RELATED APPLICATION

This application claims priority under 35 U.S.C. § 119 to Korean Patent Application No. 10-2016-0129069 filed on Oct. 6, 2016 in the Korean Intellectual Property Office, the disclosure of which is incorporated by reference herein in its entirety.

TECHNICAL FIELD

The present invention relates to a display device.

DISCUSSION OF THE RELATED ART

A flat panel display device may be relatively light and relatively thin. The flat panel display device may be an organic light emitting display device which is a self-luminous display device, and displays an image by using an organic light emitting diode to emit light; no separate light source is used. Further, the organic light emitting display device may have a relatively low power consumption, a relatively high luminance, and a relatively high response speed.

The organic light emitting display device includes a plurality of pixels, each of which includes an organic light emitting diode, a plurality of transistors for driving the organic light emitting diode, and one or more capacitors.

In general, in an emission region, the layers of the plurality of transistors are disposed to overlap each other and the layers of the capacitor are disposed to overlap each other. A charging capacity of the capacitor is in proportion to an overlapping area from overlapping electrodes in the capacitor. By increasing the charging capacity of the capacitor, a resolution of the organic light emitting display device may be increased. However, an area occupied by the capacitor is limited by a size of the display device.

SUMMARY

According to an exemplary embodiment of the present invention, a display device includes a substrate, a semiconductor layer provided on the substrate, a gate insulating layer provided on the semiconductor layer and having one or more first openings, a gate electrode provided on the gate insulating layer, a first capacitor electrode provided on the gate insulating layer, a first interlayer insulating layer provided on the gate electrode and the first capacitor electrode, and having one or more second openings, a second capacitor electrode provided on the first interlayer insulating layer, a source electrode and a drain electrode provided on the substrate, and electrically connected with the semiconductor layer, and a light emitting diode connected with the drain electrode. The first capacitor electrode includes one or more protrusions disposed in the first openings of the gate insulating layer and correspond to a shape of the first openings, and the second capacitor electrode includes one or more protrusions disposed in the second openings of the first interlayer insulating layer and correspond to a shape of the second openings.

In an exemplary embodiment of the present invention, the display device further includes a second interlayer insulating layer provided on the second capacitor electrode and having one or more third openings, and a third capacitor electrode provided on the second interlayer insulating layer. The third capacitor electrode is separated from the source electrode and the drain electrode.

In an exemplary embodiment of the present invention, an area of the third capacitor electrode is larger than an area of the second capacitor electrode.

In an exemplary embodiment of the present invention, the first openings and the second openings overlap each other, from a plan view.

In an exemplary embodiment of the present invention, the second capacitor electrode covers the first capacitor electrode, from a plan view.

In an exemplary embodiment of the present invention, an area of the second capacitor electrode is larger than an area of the first capacitor electrode.

In an exemplary embodiment of the present invention, the display device further includes a plurality of data lines connected with the source electrode, and parallel to one another. The second capacitor electrode is extended such that the second capacitor electrode crosses the plurality of data lines.

In an exemplary embodiment of the present invention, the display device further includes a power line overlapping and connected with the second capacitor electrode, and applying a fixed voltage to the second capacitor electrode.

In an exemplary embodiment of the present invention, the first openings extend in a first direction or a second direction, the second direction being substantially perpendicular to the first direction.

According to an exemplary embodiment of the present invention, a display device includes a substrate, a semiconductor layer provided on the substrate, a gate electrode overlapping the semiconductor layer, a first interlayer insulating layer provided on the gate electrode and having one or more first openings, a first capacitor electrode provided on the first interlayer insulating layer, a second interlayer insulating layer provided on the first capacitor electrode and having one or more second openings, a source electrode and a drain electrode provided on the substrate, and electrically connected with the semiconductor layer, a second capacitor electrode provided on the second interlayer insulating layer, and a light emitting diode connected with the drain electrode. The first capacitor electrode includes one or more protrusions disposed in the first openings of the first interlayer insulating layer and correspond to a shape of the first openings, and the second capacitor electrode includes one or more protrusions disposed in the second openings of the second interlayer insulating layer and correspond to a shape of the second openings.

In an exemplary embodiment of the present invention, the display device further includes a gate insulating layer provided on the semiconductor layer and having one or more third openings. The gate electrode is disposed on the gate insulating layer. The display device further includes a third capacitor electrode provided on the gate insulating layer, and provided on a same layer as the layer of the gate electrode.

In an exemplary embodiment of the present invention, the second capacitor electrode covers the first capacitor electrode, from a plan view.

In an exemplary embodiment of the present invention, the first openings and the second openings overlap each other, from a plan view.

In an exemplary embodiment of the present invention, an area of the second capacitor electrode is larger than an area of the first capacitor electrode.

In an exemplary embodiment of the present invention, an area of the first capacitor electrode is larger than an area of the third capacitor electrode.

In an exemplary embodiment of the present invention, the display device further includes a plurality of data lines connected with the source electrode, and parallel to one another. The second capacitor electrode is extended such that the second capacitor electrode crosses the plurality of data lines.

In an exemplary embodiment of the present invention, the display device further includes a power line attached to the third capacitor electrode.

In an exemplary embodiment of the present invention, the power line and the third capacitor electrode cross each other and form a lattice.

In an exemplary embodiment of the present invention, the first openings extend in a first direction or a second direction, the second direction being substantially perpendicular to the first direction.

In an exemplary embodiment of the present invention, the second capacitor electrode is separated from other elements within the display device.

According to an exemplary embodiment of the present invention, a display device, includes a substrate, a semiconductor layer disposed on the substrate, a source electrode and a drain electrode disposed on the substrate, and electrically connected with the semiconductor layer, a gate insulating layer disposed on the substrate and including at least one first indented portion, a first capacitor electrode disposed on the gate insulating layer, and including at least one first protrusion and at least one second indented portion, a first interlayer insulating layer disposed on the gate insulating layer and the first capacitor electrode, and including at least one third indented portion, a second capacitor electrode disposed on the first interlayer insulating layer, and including at least one second protrusion and at least one fourth indented portion, and a light emitting diode connected with the drain electrode. The first protrusion and the second indented portion of the first capacitor electrode overlap the first indented portion of the gate insulating layer, and the second protrusion and fourth indented portion of the second capacitor electrode overlap the third indented portion of the first interlayer insulating layer.

In an exemplary embodiment of the present invention, a shape of the first indented portion of the gate insulating layer is different from a shape of the third indented portion of the first interlayer insulating layer.

In an exemplary embodiment of the present invention, a shape of the first protrusion of the first capacitor electrode is a same as a shape of the first indented portion of the gate insulating layer, and a shape of the second protrusion of the second capacitor electrode is a same as a shape of the third indented portion of the first interlayer insulating layer.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
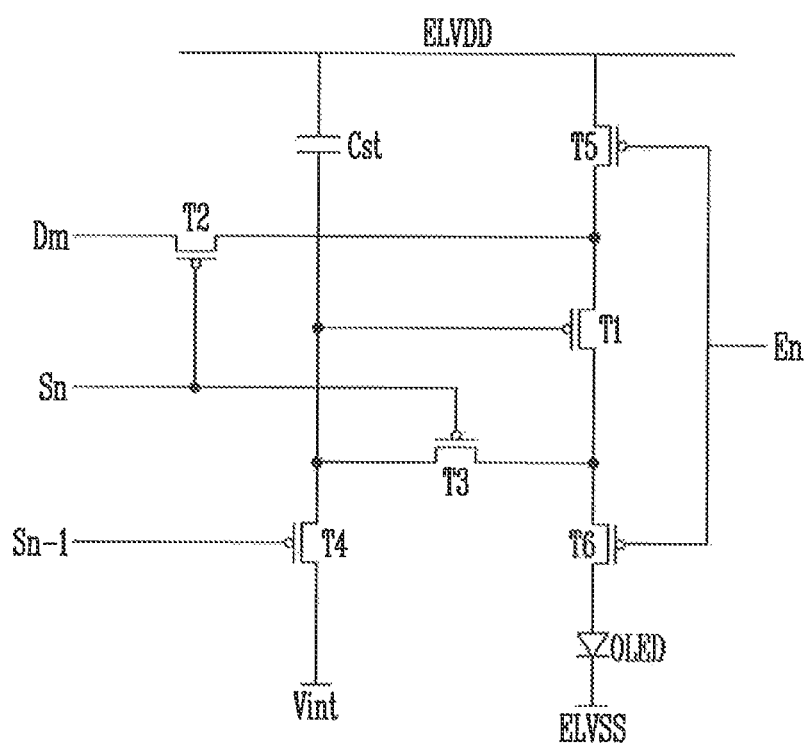
FIG. 1 is a circuit diagram illustrating a structure of a pixel included in a display device according to an exemplary embodiment of the present invention.

Exemplary embodiments of the present invention will be described more fully hereinafter with reference to the accompanying drawings. It is to be understood that the present invention may, however, be embodied in different forms and thus should not be construed as being limited to the exemplary embodiments set forth herein.

In the drawings, similar reference numerals may designate similar elements.

In the drawings, sizes and thickness of elements may be exaggerated for clarity. In other words, since sizes and thicknesses of components in the drawings may be exaggerated for clarity, the following exemplary embodiments of the present invention are not limited thereto.

Terms such as "first", "second", and the like may be used for describing various constituent elements, but the constituent elements should not be limited by these terms. The terms are used only to distinguish one constituent element from another constituent element. For example, a first element could be termed a second element, and similarly, a second element could be termed a first element without departing from the scope of the present invention. As used herein, the singular forms are intended to include the plural forms as well, unless the context clearly indicates otherwise.

It will be understood that when an element such as a layer, film, region, or substrate is referred to as being "on" another element, it can be directly on the other element or intervening elements may also be present. Further, it will be understood that when a part of a layer, a film, an area, a plate, and the like is formed on another part, a direction, in which the part is formed, is not limited to an up direction, and the direction may include a lateral direction or a down direction. In addition, it will be understood that when an element such as a layer, film, region, or substrate is referred to as being "beneath" another element, it can be directly beneath the other element or intervening elements may also be present.

In the present disclosure, "an upper surface" and "a lower surface" are used as relative concepts for describing the present invention so that a technical spirit of the present invention may be easily understood. Accordingly, "an upper surface" and "a lower surface" are not denoted specific directions, positions, or elements, and may be interchanged between each other. For example, "an upper surface" may also be construed as "a lower surface, and "a lower surface" may also be construed as "an upper surface". Accordingly, "an upper surface" may be expressed as "a first" and "a lower surface" may be expressed as "a second", and "a lower surface" may be expressed as "a first" and "an upper surface" may be expressed as "a second".

Hereinafter, exemplary embodiments of the present invention will be described in more detail.

FIG. 1 is a circuit diagram illustrating a structure of a pixel included in a display device according to an exemplary embodiment of the present invention.

Referring to FIG. 1, an organic light emitting display device may include a plurality of pixels. One of the pixels of the plurality of pixels is connected to a plurality of signal lines, and includes a plurality of transistors, a capacitor Cst, and an organic light emitting diode OLED. Hereinafter, the present invention will be described based on a pixel connected to an $m^{th}$ data line Dm and an $n^{th}$ gate line Sn, as an example. Hereinafter, the $n^{th}$ gate line Sn may be referred to as a scan line Sn.

The plurality of transistors includes a first transistor T1, a second transistor T2, a third transistor T3, a fourth transistor T4, a fifth transistor T5, and a sixth transistor T6. A wiring unit includes a scan line Sn transmitting the $n^{th}$ scan signal among a plurality of scan signals. The wiring unit additionally includes a previous scan line Sn-1 transmitting a previous scan signal to the fourth transistor T4, and an emission control line En transmitting the $n^{th}$ emission control signal among a plurality of emission signals to the fifth transistor T5 and the sixth transistor T6. The wiring unit further includes the $m^{th}$ data line Dm transmitting a data signal, a driving voltage line transmitting a driving voltage ELVDD and extending substantially parallel to the $m^{th}$ data line Dm, and an initialization voltage line transmitting an initialization voltage Vint to the first transistor T1.

A gate electrode of the first transistor T1 is connected to the first electrode of the capacitor, and a source electrode of the first transistor T1 is connected to the driving voltage line via the fifth transistor T5. Further, a drain electrode of the first transistor T1 is electrically connected to an anode of the organic light emitting diode OLED via the sixth transistor T6. The first transistor T1 receives a data signal according to a switching operation performed by the second transistor T2, and the first transistor T1 supplies a driving current to the organic light emitting diode OLED.

A gate electrode of the second transistor T2 is connected to the scan line Sn, and a source electrode of the second transistor T2 is connected to the $m^{th}$ data line Dm. Further, a drain electrode of the second transistor T2 is connected to the source electrode of the first transistor T1, and is also connected to the driving voltage line via the fifth transistor T5. The second transistor T2 performs a switching operation. The switching operation may be an operation where the second transistor T2 is turned on in response to the scan signal received through the scan line Sn, and the second transistor T2 transmits the data signal, which was transmitted through the $m^{th}$ data line Dm, to the source electrode of the first transistor T1.

The gate electrode of the third transistor T3 is connected to the scan line Sn. A source electrode of the third transistor T3 is connected to the drain electrode of the first transistor T1, and is also connected to the anode of the organic light emitting diode OLED via the sixth transistor T6. Further, a drain electrode of the third transistor T3 is connected with a drain electrode of the fourth transistor T4 and the first electrode of the capacitor Cst. The third transistor T3 is turned on according to the scan signal received through the scan line Sn, and connects the gate electrode and the drain electrode of the first transistor T1 to each other, thereby diode-connecting the first transistor T1. The driving current may flow through the diode-connected first transistor T1.

A gate electrode of the fourth transistor T4 is connected to the previous scan line Sn-1, and a source electrode of the fourth transistor T4 is connected to the initialization voltage line. Further, a drain electrode of the fourth transistor T4 is connected to the first electrode of the capacitor Cst, the drain electrode of the third transistor T3, and the gate electrode of the first transistor T1. The fourth transistor T4 is turned on in response to the previous scan signal received through the previous scan line Sn-1, and performs an initialization operation by transmitting the initialization voltage Vint to the gate electrode of the first transistor T1 in response to the previous scan signal. The voltage received by the gate electrode of the first transistor T1 is based on the initialization operation.

A gate electrode of the fifth transistor T5 is connected to the emission control line En, and a source electrode of the fifth transistor T5 is connected to the driving voltage line. A drain electrode of the fifth transistor T5 is connected with the source electrode of the first transistor T1 and the drain electrode of the second transistor T2.

A gate electrode of the sixth transistor T6 is connected to the emission control line En, and a source electrode of the sixth transistor T6 is connected to the drain electrode of the first transistor T1. Further, a drain electrode of the sixth transistor T6 is electrically connected with the anode of the organic light emitting diode OLED. When the fifth transistor T5 and the sixth transistor T6 are turned on according to the emission control signal received through the emission control line En, the driving voltage ELVDD is transmitted to the organic light emitting diode OLED. As a result of the driving voltage ELVDD, the driving current flows into the organic light emitting diode OLED.

The first electrode of the capacitor Cst is connected with the gate electrode of the first transistor T1, and a second electrode (e.g., the other electrode) of the capacitor Cst is connected with the driving voltage line. A cathode of the organic light emitting diode OLED is connected with a common voltage line that transmits a common voltage ELVSS to the cathode of the organic light emitting diode OLED. Accordingly, the common voltage line may receive the driving current from the first transistor T1 via the sixth transistor T6 so that the organic light emitting diode OILED can emit light and the display device can display an image.

Figure 2:
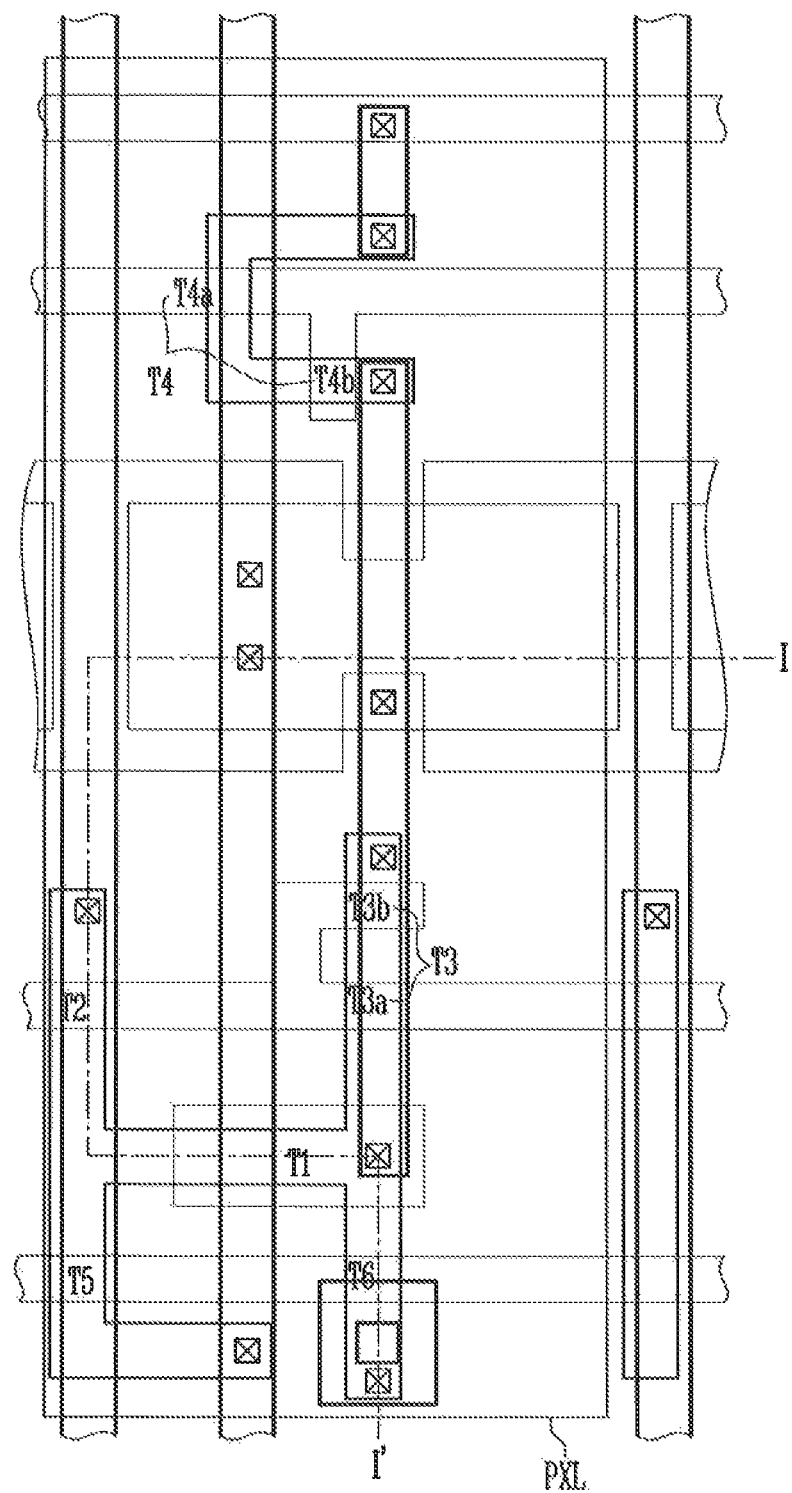
FIG. 2 is a top plan view illustrating a display device according to an exemplary embodiment of the present invention.
Figure 3:
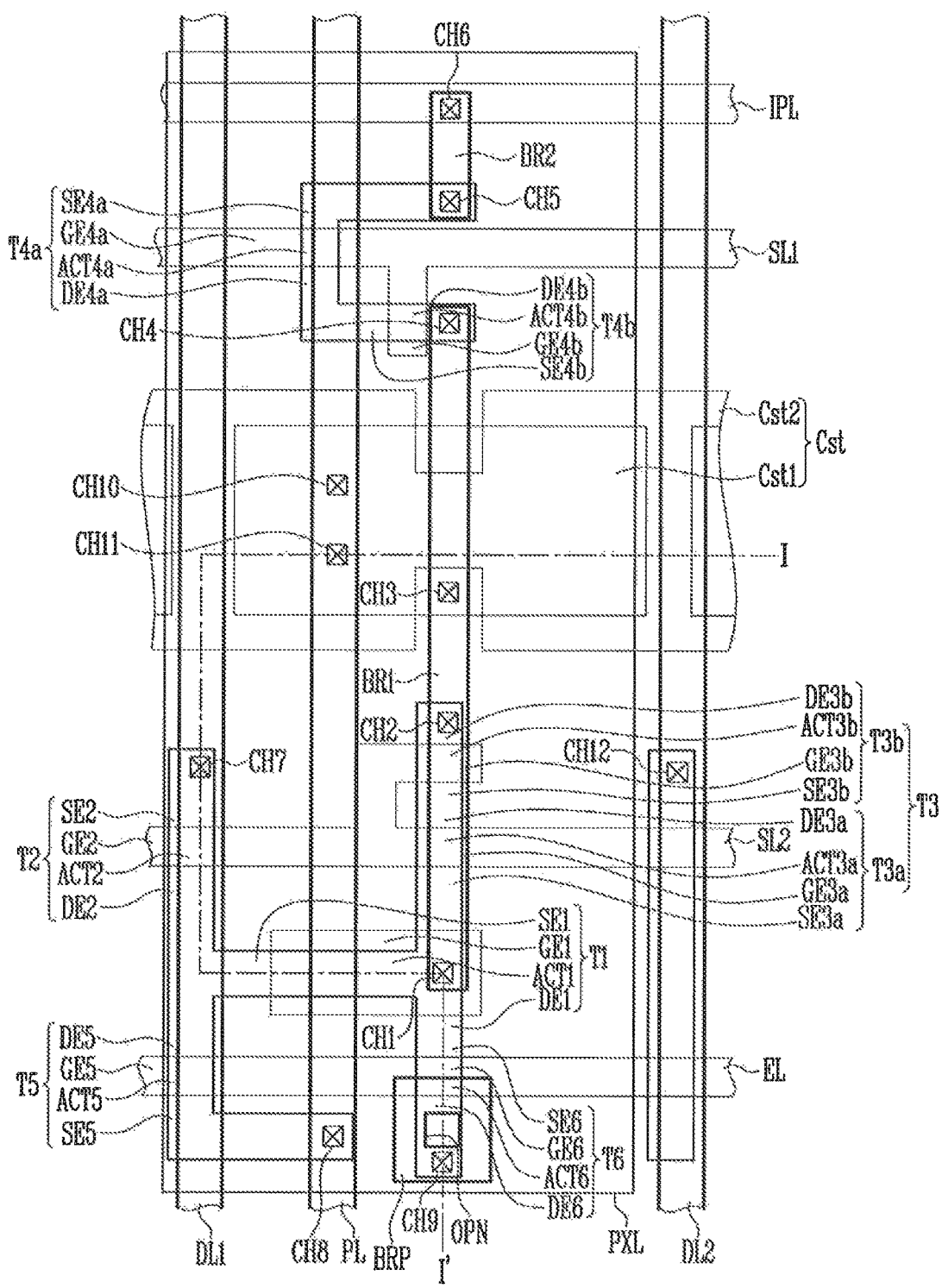
FIG. 3 is a top plan view illustrating a display device according to an exemplary embodiment of the present invention.

FIGS. 2 and 3 are top plan views illustrating a display device according to an exemplary embodiment of the present invention. The display device illustrated in FIG. 2 includes a first transistor T1, a second transistor T2, a third transistor T3, a fourth transistor T4, a fifth transistor T5, and a sixth transistor T6, like the display device illustrated in FIG. 1.

In FIG. 3, the top plan view of FIG. 2 is illustrated in more detail, and FIG. 3 illustrates a pixel included in the display device according to the present invention. The display device according to the present invention includes a plurality of pixels, but for convenience of the description, in FIG. 3, the $n-1^{th}$ scan line Sn-1 is described with reference to the first scan line SL1, the n$^{th}$ scan line Sn is described with reference to the second scan line SL2, an m-1$^{th}$ data line is described with reference to the first data line DL1, and the m$^{th}$ data line Dm is described with reference to the second data line DL2. Further, the pixel PXL adjacently disposed to the first scan line SL1, the second scan line SL2, the first data line DL1, and the second data line DL2 will be described.

In FIG. 3, each pixel PXL is illustrated as having a rectangular shape, but each pixel PXL is not limited thereto. For example, each pixel PXL may be modified to have various shapes. Further, each pixel PX may have different sizes from each other. For example, in a case of the pixels having different colors, each pixel may have a different size or a different shape according to the color it has.

According to FIG. 3, the display device includes a wiring unit and the pixel PXL. The wiring unit provides a signal to each pixel PXL. The wiring unit includes scan lines SL1 and SL2, data lines DL1 and DL2, and a power line PL. The first scan line SL1 and the second scan line SL2 are extended in a first direction. The first scan ling SL1 and the second scan line SL2 may be substantially parallel to each other. The first data line DL1 and the second data line DL2 are extended in a second direction crossing the first direction, and are substantially in parallel to each other. The power line PL may be extended in the second direction while being substantially in parallel to the first and second data lines DL1 and DL2. The first scan line SL1 and the second scan lime SL2 transmit scan signals to transistors T1 to T6, and the first data line DL1 and the second data line DL2 transmit data signals to the transistors T1 to T6. The power line PL provides a driving voltage ELVDD (see, e.g., FIG. 1) to the transistor T1 to T6. An initialization power source may be applied to an initialization power line IPL.

Each pixel PXL includes a first transistor T1 to a sixth transistor T6, a capacitor Cst, and a light emitting diode OLED.

The first transistor T1 includes a first gate electrode GE1, a first semiconductor layer ACT1, a first source electrode SE1, and a first drain electrode DE1.

The first gate electrode GE1 is connected with a 3*b* drain electrode DE3*b* of the third transistor T3 and a 4*b* drain electrode DE4*b* of the fourth transistor T4 through a first bridge BR1. Further, the first bridge BR1 connects the 3*b* drain electrode DE3*b* to the first gate electrode GE1 by using a first contact hole CH1 connected with the first gate electrode GE1 and a second contact hole CH2 connected with the 3*b* drain electrode DE3*b*. Further, the first bridge BR1 connects the 4*b* drain electrode DE4*b* and the first gate electrode GE1 by using a fourth contact hole CH4 connected with the 4*b* drain electrode DE4*b* and the first contact hole CH1 connected with the first gate electrode GE1.

In the exemplary embodiment of the present invention, the first semiconductor layer ACT1 may be a semiconductor layer, which is not doped with impurities. Further, the first source electrode SE1 and the first drain electrode DE1 may be semiconductor layers, which are doped with impurities. The first semiconductor layer ACT1 may have a rod shape extended in a predetermined direction, and may be bent several times in a longitudinal direction. The first semiconductor layer ACT1 overlaps the first gate electrode GE1, from a plan view. The first semiconductor layer ACT1 may be elongated, so that a channel region of the first transistor T1 may be elongated. Accordingly, a driving range of a gate voltage applied to the first transistor T1 may be increased. Further, according to the driving range of the gate voltage, a ray of light emitted from the light emitting diode OLED may be finely controlled.

The first source electrode SE1 is connected to one end of the first semiconductor layer ACT1, and is connected with the second drain electrode DE2 of the second transistor T2 and a fifth drain electrode DE5 of the fifth transistor T5. The first drain electrode DE1 is connected to the other end of the first semiconductor layer ACT1, and is connected with a third source electrode SE3 of the third transistor T3 and a sixth source electrode SE6 of the sixth transistor T6.

The second transistor T2 includes a second gate electrode GE2, a second semiconductor layer ACT2, a second source electrode SE2, and the second drain electrode DE2.

The second gate electrode GE2 is connected to the second scan line SL2. The second gate electrode GE2 may be provided as a part of the second scan line SL2 or may be provided as a shape protruding from the second scan line SL2. In the exemplary embodiment of the present invention, the second semiconductor layer ACT2 may be a semiconductor layer, which is not doped with impurities. Further, the second source electrode SE2 and the second drain electrode DE2 may be semiconductor layers, which are doped with impurities. The second semiconductor layer ACT2 overlaps the second gate electrode GE2, from a plan view. The second source electrode SE2 is connected to the first data line DL1 through a seventh contact hole CH7. The second drain electrode DE1 is connected with the first source electrode SE2 of the first transistor T1 and the fifth drain electrode DE5 of the fifth transistor T5.

The third transistor T3 may be provided as a dual gate structure for preventing leakage current. For example, the third transistor T3 may include a 3*a* transistor T3*a* and a 3*b* transistor T3*b*. The 3*a* transistor T3*a* may include a 3*a* gate electrode GE3*a*, a 3*a* semiconductor layer ACT3*a*, a 3*a* source electrode SE3*a*, and a 3*a* drain electrode DE3*a*, and the 3*b* transistor T3*b* may include a 3*b* gate electrode GE3*b*, a 3*b* semiconductor layer ACT3*b*, a 3*b* source electrode SE3*b*, and a 3*b* drain electrode DE3*b*. Hereinafter, the 3*a* gate electrode GE3*a* and the 3*b* gate electrode GE3*b* will be referred to as a third gate electrode GE3, the 3*a* semiconductor layer ACT3*a* and the 3*b* semiconductor layer ACT3*b* will be referred to as a third semiconductor layer ACT3, the 3*a* source electrode SE3*a* and the 3*b* source electrode SE3*b* will be referred to as a third source electrode SE3, and the 3*a* drain electrode DE3*a* and the 3*b* drain electrode DE3*b* will be referred to as a third drain electrode DE3.

The third gate electrode GE3 is connected to the second scan line SL2. The third gate electrode GE3 is provided as a part of the second scan line SL2 or is provided in a shape protruding from the second scan line SL2, in the exemplary embodiment of the present invention, the third semiconductor layer ACT3 may be a semiconductor layer, which is not doped with impurities. Further, the third source electrode SE3 and the third drain electrode DE3 may be semiconductor layers, which are doped with impurities. The third semiconductor layer ACT3 overlaps the third gate electrode GE3, from a plan view. One end of the third source electrode SE3 is connected to the third semiconductor layer ACT3, and the other end of the third source electrode SE3 is connected with the first drain electrode DE1 of the first transistor T1 and a sixth source electrode SE6 of the sixth transistor T6. Further, the first bridge BR1 connects the third drain electrode DE3 to the first gate electrode GE1 through the second contact hole CH2 connected to the third drain electrode DE3 and the first contact hole CH1 connected to the first gate electrode GE1.

The fourth transistor T4 may be provided as a dual gate structure for preventing leakage current. For example, the fourth transistor T4 may include a 4*a* transistor T4*a* and a 4*b* transistor T4*b*. The 4*a* transistor T4*a* may include a 4*a* gate electrode GE4*a*, a 4*a* semiconductor layer ACT4*a*, a 4*a* source electrode SE4*a*, and a 4*a* drain electrode DE4*a*, and the 4*b* transistor T4*b* may include a 4*b* gate electrode GE4*b*, a 4*b* semiconductor layer ACT4*b*, a 4*b* source electrode SE4*b*, and a 4*b* drain electrode DE4*b*. Hereinafter, the 4*a* gate electrode GE4*a* and the 4*b* gate electrode GE4*b* will be referred to as a fourth gate electrode GE4, the 4*a* semiconductor layer ACT4*a* and the 4*b* semiconductor layer ACT4*b* will be referred to as a fourth semiconductor layer ACT4, the 4*a* source electrode SE4*a* and the 4*b* source electrode SE4*b* will be referred to as a fourth source electrode SE4, and the 4*a* drain electrode DE4*a* and the 4*b* drain electrode DE4*b* will be referred to as a fourth drain electrode DE4.

The fourth gate electrode GE4 is connected to the first scan line SL1. The fourth gate electrode GE4 is provided as a part of the first scan line SL1 or is provided in a shape protruding from the first scan line SL1. In the exemplary embodiment of the present invention, the fourth semiconductor layer ACT4 may be a semiconductor layer, which is not doped with impurities. Further, the fourth source electrode SE4 and the fourth drain electrode DE4 may be semiconductor layers, which are doped with impurities. The fourth semiconductor layer ACT4 overlaps the fourth gate electrode GE4, from a plan view. One end of the fourth source electrode SE4 is connected to the fourth semiconductor layer ACT4 and the other end of the fourth source electrode SE4 is connected to the initialization power line IPL. The fourth source electrode SE4 and the initialization power line IPL are connected by a second bridge BR2. The second bridge BR2 and the fourth source electrode SE4 are connected to each other through a fifth contact hole CH5, and the initialization power line IPL and the second bridge BR2 are connected to each other through a sixth contact hole CH6.

The fifth transistor T5 includes a fifth gate electrode GE5, a fifth semiconductor layer ACT5, the fifth source electrode SE5, and the fifth drain electrode DE5.

The fifth gate electrode GE5 is connected to the emission control line EL. The fifth gate electrode GE5 is provided as a part of the emission control line EL, or is provided as a shape protruding from the emission control line EL. In the exemplary embodiment of the present invention, the fifth semiconductor layer ACT5 may be a semiconductor layer, which is not doped with impurities. Further, the fifth source electrode SE5 and the fifth drain electrode DE5 may be semiconductor layers, which are doped with impurities. The fifth semiconductor layer ACT5 overlaps the fifth gate electrode GE5, from a plan view. One end of the fifth source electrode SE5 is connected to the fifth semiconductor layer ACT5, and the other end of the fifth source electrode SE5 is connected to a power line PL through an eighth contact hole CH8. One end of the fifth drain electrode DE5 is connected to the fifth semiconductor layer ACT5, and the other end of the fifth drain electrode DE5 is connected with the first source electrode SE1 of the first transistor T1 and the second drain electrode DE2 of the second transistor T2.

The sixth transistor T6 includes a sixth gate electrode GE6, a sixth semiconductor layer ACT6, a sixth source electrode SE6, and a sixth drain electrode DE6.

The sixth gate electrode GE6 is connected to the emission control line EL. The sixth gate electrode GE6 is provided as a part of the emission control line EL, or is provided as a shape protruding from the emission control line EL. In the exemplary embodiment of the present invention, the sixth semiconductor layer ACT6 may be a semiconductor layer, which is not doped with impurities. Further, the sixth source electrode SE6 and the sixth drain electrode DE6 may be semiconductor layers, which are doped with impurities. The sixth semiconductor layer ACT6 overlaps the sixth gate electrode GE6, from a plan view. One end of the sixth source electrode SE6 is connected to the sixth semiconductor layer ACT6, and the other end of the sixth source electrode SE6 is connected with the first drain electrode DE1 of the first transistor T1 and the third source electrode SE3 of the third transistor T3. One end of the sixth drain electrode DE6 is connected to the sixth semiconductor layer ACT6, and the other end of the sixth drain electrode DE6 is connected with a bride pattern BRP through a ninth contact hole CH9. The bridge pattern BRP includes an opening OPN.

The capacitor Cst according to the exemplary embodiment of the present invention may include a first capacitor electrode Cst1 and a second capacitor electrode Cst2. The first capacitor electrode Cst1 is connected with the first bridge BR1 and the first gate electrode GE1 through the third contact hole CH3. The second capacitor electrode Cst2 is connected with the power line PL through a tenth contact hole CH10 and an eleventh contact hole CH11. A fixed voltage having a predetermined amount is applied to the second capacitor electrode Cst2 through the power line PL.

The second capacitor electrode Cst2 is formed on the first capacitor electrode Cst1. An area of the second capacitor electrode Cst2 is larger than an area of the first capacitor electrode Cst1, so that the second capacitor electrode Cst2 covers the first capacitor electrode Cst1, from a plan view. The second capacitor electrode Cst2 crosses the first data line DL1 and the second data line DL2. The second capacitor electrode Cst2 is continuously extended in a direction crossing the first and second data lines DL1 and DL2. The second capacitor electrode Cst2 may extend in the first direction. Accordingly, the second capacitor electrode Cst2 may cross the plurality of other data lines, in addition to crossing the first and second data lines DL1 and DL2.

Figure 4:
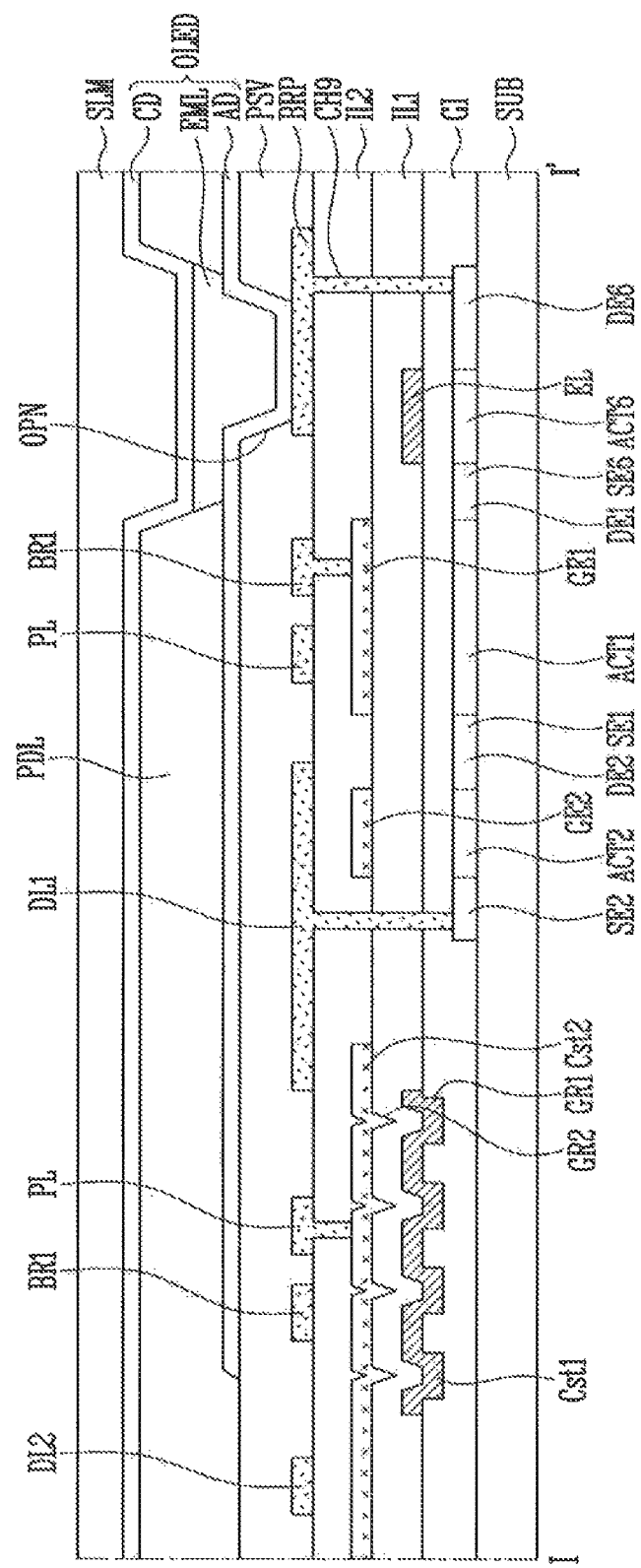
FIG. 4 is a cross-sectional view taken along line of FIG. 2.

FIG. 4 is a cross-sectional view taken along line I-I' of FIG. 2. Hereinafter, FIG. 4 will be described with reference to FIG. 3.

A lamination sequence (e.g., a stacking sequence) of the structure of the display device according to the exemplary embodiment of the present invention will be described. First, the semiconductor layers ACT1 to ACT6 are formed on a base substrate SUB. The semiconductor layers ACT1 to ACT6 may include an oxide semiconductor, an inorganic semiconductor, or an organic semiconductor. The oxide semiconductor may be formed of for example, zinc oxide (ZnO), indium oxide (InO), indium-gallium-zinc oxide (In—Ga—Zn—O), or zinc-tin oxide (Zn—Sn—O), or oxides including at least two or more elements of zinc (Zn), indium (In), gallium (Ga), tin (Sn), and aluminum (Al). The inorganic semiconductor may include, for example, amorphous silicon, polysilicon, or the like. The semiconductor layers ACT1 to ACT6 may be formed by using photolithography.

The first, second and sixth source electrodes SE1, SE2 and SE6, and the first, second and sixth drain electrodes DE1, DE2 and DE6 may be formed on the base substrate SUB. The first source electrode SE1 and first drain electrode DE1 may be connected to first semiconductor layer ACT1. The second source electrode SE2 and second drain electrode DE2 may be connected to second semiconductor layer ACT2. The sixth source electrode SE6 and sixth drain electrode DE6 may be connected to sixth semiconductor layer ACT6.

A gate insulating layer GI is formed on the semiconductor layers ACT1 to ACT6. In this case, the gate insulating layer GI according to the exemplary embodiment of the present invention may include one or more first projected portions GR1. Accordingly, the gate insulating layer GI and the first projected portion GR1 has a curved form. For example, the first projected portions GR1 may be an opening or an indentation. The form, a size, or the number of first projected portions GR1 is not limited. For example, the number of first projected portions GR1 may be one, two or more. Further, the first projected portion GR1 may have a concave or convex form, and the first projected portion GR1 may have various shapes from a cross-sectional view, such as a trapezoidal shape, a quadrangular shape, a semi-circular shape, a polygonal shape, and a shape that tapers. Further, the first projected portion GR1 may have a shape that extends in the first direction or the second direction, which is substantially perpendicular to the first direction. In addition, the first projected portion GR1 may have an embossed shape. A depth of the first projected portion GR1 is not limited, but may be smaller than a thickness of the gate insulating layer GI. The first projected portion GR1 may be formed by photolithography. However, a method of forming the first projected portion GR1 is not limited to the photolithography.

The first capacitor electrode Cst1, the first scan line SL1, and the emission control line EL may be provided on the same layer. For example, first capacitor electrode Cst1, the first scan line SL1, and the emission control line EL may be provided on the gate insulating layer GI. The first capacitor electrode Cst1 has a curved (e.g., indented) form corresponding to the shape of the first projected portion GR1 of the gate insulating layer GI. The reason is that the first capacitor electrode Cst1 is disposed on the gate insulating layer GI along the curve of the first projected portion GR1. For example, the first capacitor electrode Cst1 may include at least one protrusion that is disposed in the first projected portion GR1 and corresponds to the shape of the first projected portion GR1. Further, the first capacitor electrode Cst1 may include at least one indented portion overlapping the protrusion. Accordingly, the first capacitor electrode Cst1 may also have a shape that extends in the first direction or the second direction. In addition, the first capacitor electrode Cst1 may have an embossed shape, similar to the first projected portion GR1 of the gate insulating layer GI.

A first interlayer insulating layer IL1 may be provided on the gate insulating layer GI, and may cover the first capacitor electrode Cst1. The first interlayer insulating layer IL1 may have a second projected portion GR2 (e.g., an opening or an indention) overlapping the first projected portion GR1, from a plan view. Accordingly, the first interlayer insulating layer IL1 may have a curved form that corresponds to the form of the gate insulating layer GI and the form of the first capacitor electrode Cst1. For example, the second projected portion GR2 may be an opening or an indentation. The second projected portion GR2 may have a shape that extends in the first direction or the second direction. In addition, the second projected portion GR2 may have an embossed shape. When the first interlayer insulating layer IL1 is formed on the first capacitor electrode Cst1, the second projected portion GR2 of the first interlayer insulating layer IL1 may be formed by at least partially conforming to the shape of the first capacitor electrode Cst1 formed on the first projected portion GR1. For example, the second projected portion GR2 may overlap the indented portion of the first capacitor electrode Cst1, and the shape of the second projected portion GR2 may correspond to a shape of the indented portion. Accordingly, a depth of the second projected portion GR2 may be smaller than a depth of the first projected portion GR1. Further, a shape of the cross-section of the second projected portion GR2 might not correspond to a shape of the cross-section of the first projected portion GR1. For example, when the cross-section of the first projected portion GR1 has a trapezoidal shape, the cross-section of the second projected portion GR2 may have a tapered triangular shape.

The second capacitor electrode Cst2, the initialization power line IPL, the second scan line SL2, and the first gate electrode GE1 may be formed on the first interlayer insulating layer IL1. The second capacitor electrode Cst2 has a curved (e.g., indented) form corresponding to the shape of the second projected portion GR2 of the first interlayer insulating layer IL1. The reason is that the second capacitor electrode Cst2 is disposed on the first interlayer insulating layer IL1 along the curve of the second projected portion GR2. For example, the second capacitor electrode Cst2 may include at least one protrusion that is disposed in the second projected portion GR2 and corresponds to the shape of the second projected portion GR2. Further, the second capacitor electrode Cst2 may include at least one indented portion overlapping the protrusion. Accordingly, the second capacitor electrode Cst2 may also have a shape that extends in the first direction or the second direction. In addition, the second capacitor electrode Cs2 may have an embossed form, similar to the second projected portion GR2 of the first interlayer insulating layer IL1.

The first capacitor electrode Cst1 and the second capacitor electrode Cst2 have the curved forms (e.g., forms including indentations and protrusions), so that be area of the first capacitor electrode Cst1 and the area of the second capacitor electrode Cst2 may be increased. The areas of the first capacitor electrode Cst1 and the second capacitor electrode Cst2 are related to a charging capacity of the capacitor Cst. The reason is that when an overlapping area of the first capacitor electrode Cst1 and the second capacitor electrode Cst2 is large, the charging capacity of the capacitor Cst is increased. Further, the charging capacity of the capacitor Cst may be determined by Equation 1 below.

$$C = \frac{\varepsilon A}{d} \qquad \text{[Equation 1]}$$

(C is charging capacity of the capacitor, ε is a dielectric constant, A is an overlapping area of the capacitor electrodes, and d is a distance between the capacitor electrodes).

According to Equation 1, the charging capacity of the capacitor Cst is in proportion to the overlapping area of the capacitor electrodes Cst1 and Cst2, and is inversely proportional to the distance between the capacitor electrodes Cst1 and Cst2. Accordingly, to increase the charging capacity of the capacitor Cst, the distance between the capacitor electrodes Cst1 and Cst2 may be decreased, or the overlapping area of the capacitor electrodes Cst1 and Cst2 may be increased. However, there is a limitation in decreasing the distance between the capacitor electrodes Cst1 and Cst2, which corresponds to the thickness of the first interlayer insulating layer IL1. When the thickness of the first interlayer insulating layer IL1 is excessively decreased, a short may be generated between the first capacitor electrode Cst1 and the second capacitor electrode Cst2. Accordingly, to increase the charging capacity of the capacitor Cst, the overlapping area of the first capacitor electrode Cst1 and the second capacitor electrode Cst2 may be increased. However in increasing the overlapping area of the first capacitor electrode Cst1 and the second capacitor electrode Cst2, the size of the overlapping area is limited by a size of the pixel.

According to the exemplary embodiment of the present invention, even in a pixel having a small size, it is possible to increase the overlapping area of the first capacitor electrode Cst1 and the second capacitor electrode Cst2. The first capacitor electrode Cst1 and the second capacitor electrode Cst2 have the curved forms corresponding to the shapes of the first projected portion GR1 and the second projected portion GR2, respectively, so that the first capacitor electrode Cst1 and the second capacitor electrode Cst2 have the relatively large areas. For example, compared to an electrode having a flat form, the electrode having the curved form has a larger area in the same width as the electrode having the flat form. Accordingly, according to the exemplary embodiment of the present invention, the thickness of the first interlayer insulating layer IL1 may be substantially maintained, so that the generation of a short may be prevented, and the charging capacity of the capacitor Cst may be increased.

A second interlayer insulating layer IL2 may be provided on the second capacitor electrode Cst2 and the first interlayer insulating layer IL1. Further, the first data line DL1, the second data line DL2, the power line PL, the first bridge BR1, the second bridge BR2, and the bridge pattern BRP may be provided on the same layer. For example, the first data line DL1, the second data line DL2, the power line PL, the first bridge BR1, the second bridge BR2, and the bridge pattern BRP may be provided on the second interlayer insulating layer IL2.

A passivation layer PSV including the opening OPN is provided on the bridge pattern BRP. The opening OPN exposes at least a part of the bridge pattern BRP. The anode AD of the organic light emitting diode OLED is disposed on the passivation layer PSV, and the anode AD and the bridge pattern BRP are electrically connected to each other through the opening OPN. A pixel defining layer PDL and an emission layer EML are provided on the anode AD. The cathode CD of the organic light emitting diode OLED is provided on the emission layer EML. The anode AD, the emission layer EML, and the cathode CD form the organic light emitting diode OLED. A sealing layer SLM covering the cathode CD is provided on the cathode CD. The display device according to the exemplary embodiment of the present invention may include the organic light emitting diode OLED including the cathode CD, the anode AD, and the emission layer EML. However, the light emitting device of the display device according to the present invention is not limited thereto. Those skilled in the art may adopt various light emitting devices to be included in the display device, such as an electrophoretic device, instead of the organic light emitting diode.

In an exemplary embodiment of the present invention, the second interlayer insulating layer IL2 including at least one third projected portion, and a third capacitor electrode, which may be provided on the second interlayer insulating layer IL2 and on the same layer as that of a source electrode and a drain electrode of a transistor of the display device, may be disposed on the second capacitor electrode Cst2. In this case, an area of the third capacitor electrode may be larger than the area of the second capacitor electrode Cst2.

Figure 5:
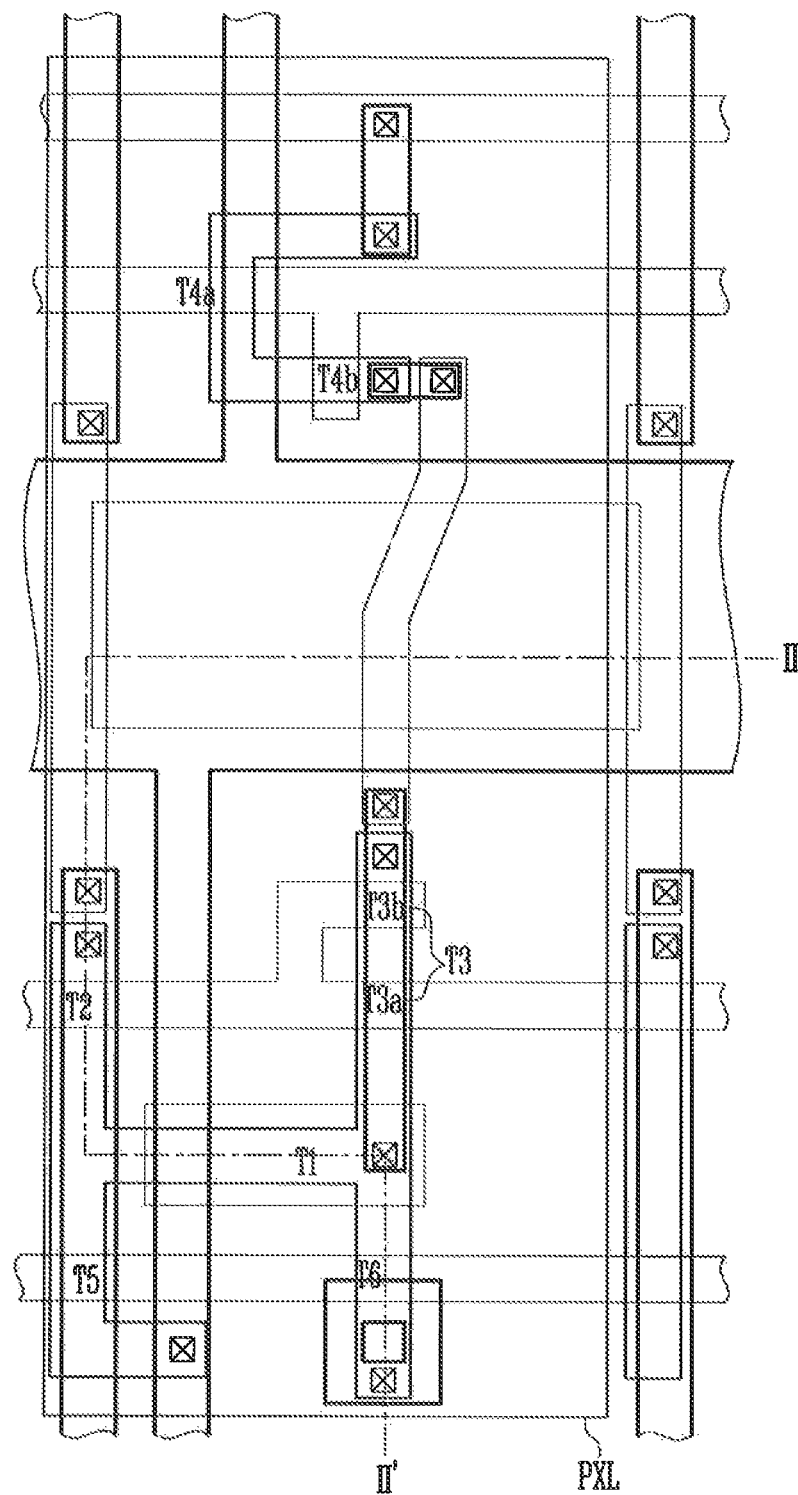
FIG. 5 is a top plan view illustrating a display device according to an exemplary embodiment of the present invention.

FIG. 5 is a top plan view illustrating a display device according to an exemplary embodiment of the present invention. The display device illustrated in FIG. 5 includes a first transistor T1, a second transistor T2, a third transistor T3, a fourth transistor T4, a fifth transistor T5, and a sixth transistor T6, like the display device illustrated in FIG. 1.

Figure 6:
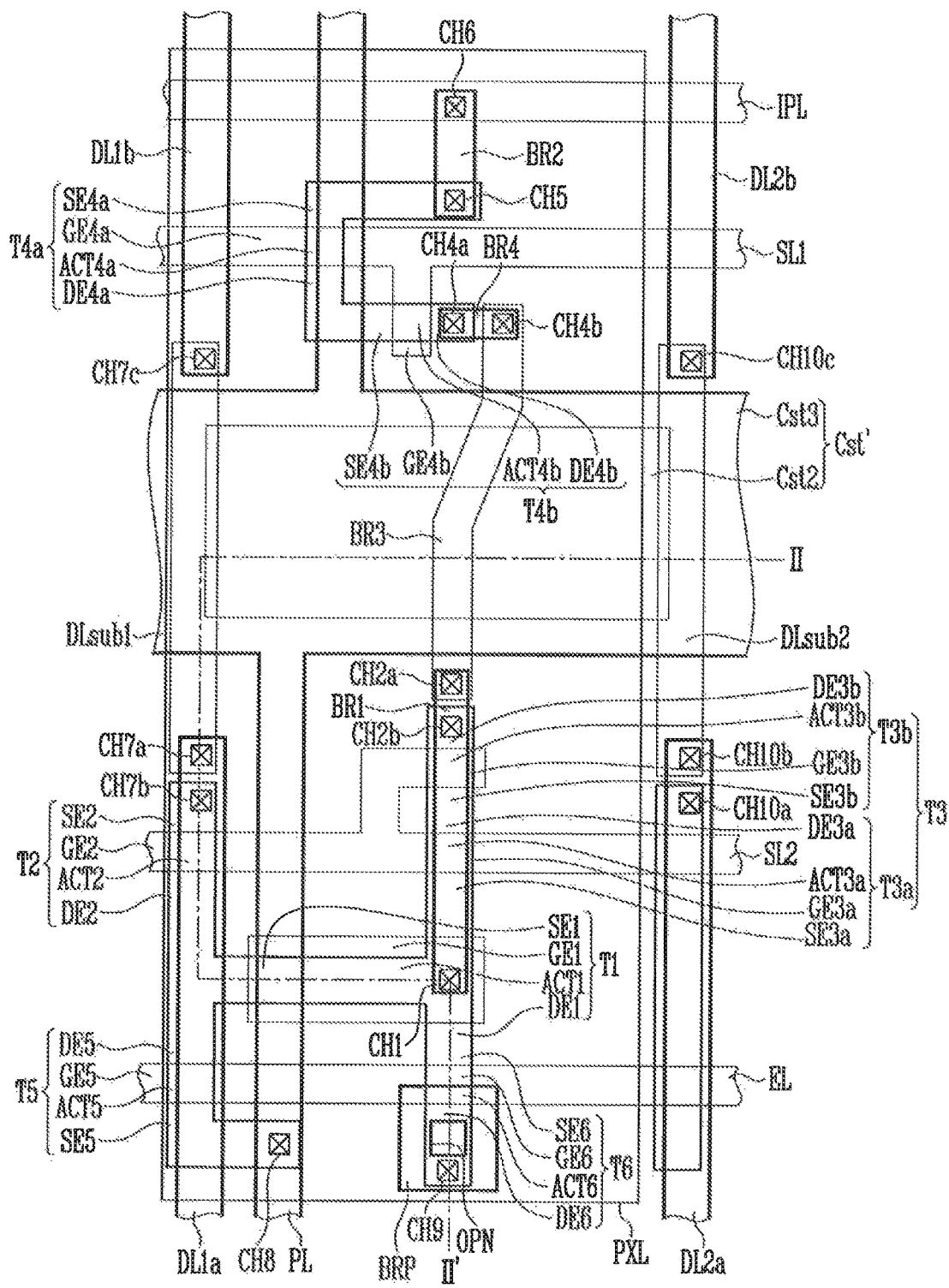
FIG. 6 is a top plan view illustrating a display device according to an exemplary embodiment of the present invention.

FIG. 6 is a top plan view illustrating a display device according to an exemplary embodiment of the present invention. The display device according to the exemplary embodiment, in FIG. 6, has a similar configuration and elements to that of the display device of FIG. 3. However, the display device according to the exemplary embodiment, in FIG. 6, has some different configurations and elements from that of the display device of FIG. 3. Accordingly, hereinafter, the different configurations and elements may mainly be described. The non-mentioned configurations and elements among the configurations and elements included in the display device of FIG. 6, according to the exemplary embodiment, follow the descriptions of the configurations and elements disclosed in FIG. 3.

The display device of FIG. 6 includes a second capacitor electrode Cst2 and a third capacitor electrode Cst3. The second capacitor electrode Cst2 may be in a floating state separated from other elements within the display device. However, the second capacitor electrode Cst2 may also be electrically connected with other elements within the display device as necessary. A third capacitor electrode Cst3 is provided on the second capacitor electrode Cst2. The third capacitor electrode Cst3 is integrally formed with the power line PL. For example, the third capacitor electrode Cst3 and the power line PL may form a single body. In addition, the third capacitor electrode Cst3 has a form, in which a part of the power line PL, which is integrally formed in the third capacitor electrode Cst3, is extended in the first direction and another part of the power line PL is extended in the second direction.

First data lines DL1a, DL1b, and DLsub1 and second data lines DL2a, DL2b, and DLsub2 of the display device of FIG. 6 have different forms from those of the first data line DL1 and the second data line DL2 of the display device of FIG. 3. Some of the first data lines DL1a, DL1b, and DLsub1 and the second data lines DL2a, DL2b, and DLsub2 are disposed on the same layer as that of the power line PL. However, to prevent a connection between the third capacitor electrode Cst3 and the data lines DL1a, DL1b, DLsub1, DL2a, DL2b, and DLsub2, some of the data lines DL1a, DL1b, DLsub1, DL2a, DL2b, and DLsub2 may be disposed on the same layer as that of the emission control line EL, which is a different layer from which the third capacitor electrode Cst3 is provided on. For example, a second sub data line DLsub2 may be disposed on the same layer as that of the emission control line EL. The first data lines DL1a, DL1b, and DLsub1 are connected to one another through a 7a contact hole CH7a and a 7c contact hole CH7c. Further, the second data lines DL2a, DL2b, and DLsub2 are connected to one another through a 10b contact hole CH10b and a 10c contact hole CH10c. Further, the 1a data line DL1a and a second source electrode SE2 of the second transistor T2 is connected to each other by a 7b contact hole CH7b.

The first gate electrode GE1, the third drain electrode DE3, and the fourth drain electrode DE4 are connected to each other through the first bridge BR1 in the display device of FIG. 3, but the display device of FIG. 6 includes a first bridge BR1, a third bridge BR3, and a fourth bridge BR4 for connecting the aforementioned elements. Further, the first bridge BR1 of FIG. 6 is a different form from that of the first bridge BR1 of FIG. 3. In addition, the first gate electrode GE1, the third drain electrode DE3, and the third bridge BR3 are connected with the first bridge BR1, through a first contact hole CH1, a 2b contact hole CH2b, and a 2a contact hole CH2a, respectively. However, the 2a contact hole CH2a and the 2b contact hole CH2b may be a single contact hole. The third bridge BR3 is connected with the first bridge BR1 through the 2a contact hole CH2a, and is connected with a fourth bridge BR4 through a 4b contact hole CH4b.

The fourth bridge BR4 connects a fourth drain electrode DE4 and the third bridge BR3 through a 4*a* contact hole CH4*a* and the 4*b* contact hole CH4*b*. However, the 4*a* contact hole CH4*a* and the 4*b* contact hole CH4*b* may be a single contact hole.

Figure 7:
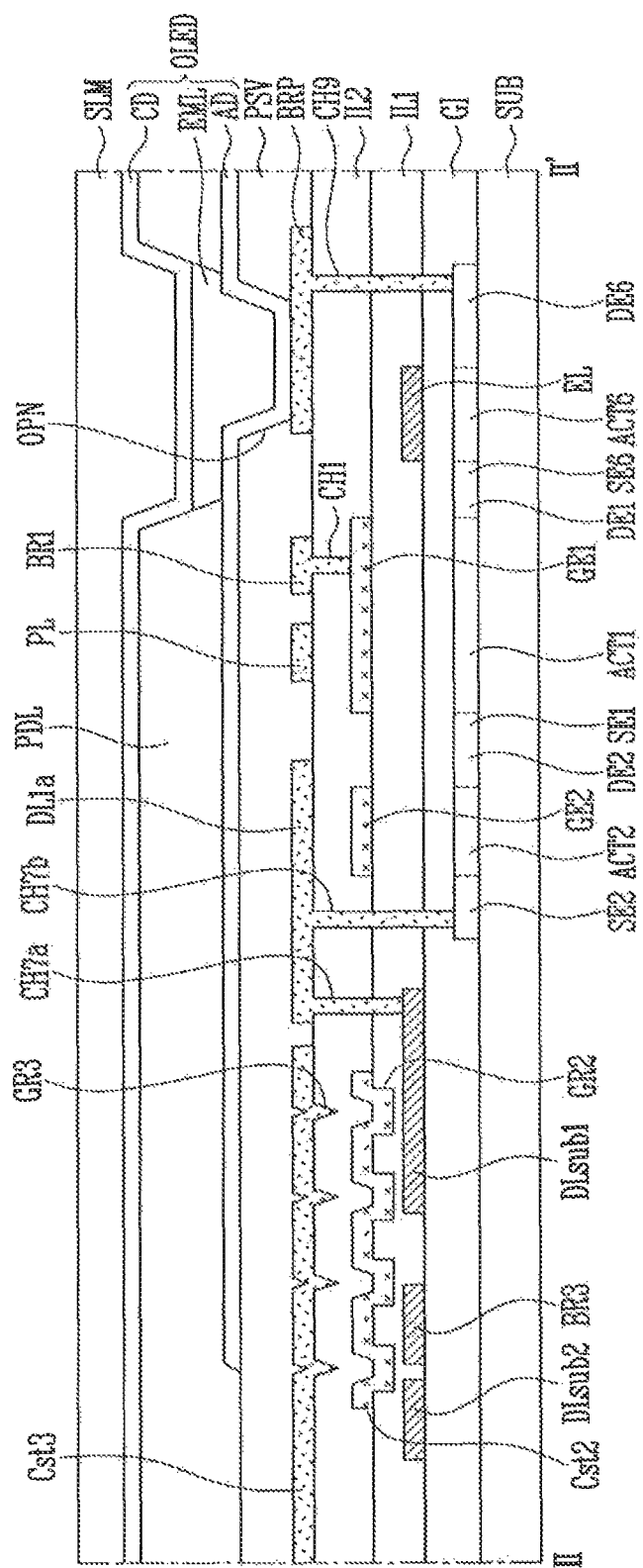
FIG. 7 is a cross-sectional view taken along line II-II' of FIG. 5.

FIG. 7 is a cross-sectional view taken along line II-II' of FIG. 6. Hereinafter, FIG. 7 will be described with reference to FIG. 6.

A lamination sequence of the structure of the display device according to an exemplary embodiment of the present invention will be described. First, semiconductor layers ACT1 to ACT6 are formed on a base substrate SUB. The semiconductor layers ACT1 to ACT6 are the same as those described above.

A gate insulating layer GI is formed on the semiconductor layers ACT1 to ACT6. According to FIG. 7, the gate insulating layer GI is not curved, but is flat.

A first scan line SL1, an emission control line EL, a first sub data line DLsub1, the second sub data line DLsub2, and the third bridge BR3 may be provided on the same layer. For example, the first scan line SL1, the emission control line EL, the first sub data line DLsub1, the second sub data line DLsub2, and the third bridge BR3 may be provided on the gate insulating layer GI. The first sub data line DLsub1 and the second sub data line DLsub2 are formed on a different layer from that of the third capacitor electrode Cst3 as described above, so that the first sub data line DLsub1 and the second sub data line DLsub2 are not connected to each other through a connection with the third capacitor electrode Cst3, even though the third capacitor electrode Cst3 crosses the first and second sub data lines DLsub1 and DLsub2.

A first interlayer insulating layer IL1 is provided on the emission control line EL. The first interlayer insulating layer IL1 may include at least one second projected portion GR2. Accordingly, the first interlayer insulating layer IL1 including the second projected portion GR2 has a curved form. The form, a size, or the number of second projected portions GR2 is not limited. For example, the number of second projected portions GR2 may be one, two or more. Further, a cross section of the second projected portion GR2 may have various shapes, such as a trapezoidal shape, a quadrangular shape, a semi-circular shape, and a shape that tapers. Further, the second projected portion GR2 may have a shape that extends in the first direction or the second direction. In addition, the second projected portion GR2 may have an embossed form. A depth of the second projected portion GR2 is not limited, but may be smaller than a thickness of the first interlayer insulating layer IL1. The reason is that when the depth of the second projected portion GR2 is, for example, equal to the thickness of the first interlayer insulating layer IL1, so that the second projected portion GR2 may have an opening, a short may be generated between an electrode disposed on the second projected portion GR2 and other elements of the display device. The second projected portion GR2 may be formed by etching. However, the method of forming the second projected portion GR2 is not limited to etching, and when the first interlayer insulating layer IL1 is formed of an organic material, the second projected portion GR2 may also be formed by hardening. A second capacitor electrode Cst2, an initialization power line IPL, a second scan line SL2, and a first gate electrode GE1 may be provided on the same layer that is provided on the first interlayer insulating layer IL1. The second capacitor electrode Cst2 has a curved form corresponding to the shape of the second projected portion GR2 of the first interlayer insulating layer IL1. The reason is that the second capacitor electrode Cst2 is disposed on the first interlayer insulating layer IL1 along the curve of the second projected portion GR2. Accordingly, the second capacitor electrode Cst2 may also have a shape that extends in the first direction or the second direction. In addition, the second capacitor electrode Cst2 may have an embossed form, similar to the second projected portion GR2 of the first interlayer insulating layer IL1.

A second interlayer insulating layer IL2 may be provided on the second capacitor electrode Cst2. The second interlayer insulating layer IL2 may have a third projected portion GR3 (e.g., an opening or indentation) overlapping the second projected portion GR2, from a plan view. Accordingly, the second interlayer insulating layer IL2 may be curved in a form that corresponds to the form of the first interlayer insulating layer IL1 and the form of the second capacitor electrode Cst2. The third projected portion GR3 may have a shape that extends in the first direction or the second direction. In addition, the third projected portion GR3 may have embossed form. When the second interlayer insulating layer IL2 is formed on the second capacitor electrode Cst2, the third projected portion GR3 of the second interlayer insulating layer IL2 may be formed by at least partially conforming to the shape of the second capacitor electrode Cst2 formed on the second projected portion GR2. Accordingly, a depth of the third projected portion GR3 may be smaller than a depth of the second projected portion GR2. Further, a shape of the cross-section of the third projected portion GR3 might not correspond to a shape of the cross-section of the second projected portion GR2. For example, when the cross-section of the second projected portion GR2 has a trapezoidal shape, the cross-section of the third projected portion GR3 may have a tapered triangular shape.

A third capacitor electrode Cst3, a 1*a* data line DL1*a*, a 1*b* data line DL1*b*, a 2*a* data line DL2*a*, a 2*b* data line DL2*b*, a power line PL, a first bridge BR1, a second bridge BR2, a fourth bridge BR4, and a bridge pattern BRP may be provided on the same layer that is provided on the second interlayer insulating layer IL2.

The third capacitor electrode Cst3 is formed on the second capacitor electrode Cst2. An area of the third capacitor electrode Cst3 is larger than an area of the second capacitor electrode Cst2, so that the third capacitor electrode Cst3 covers the second capacitor electrode Cst2, from a plan view. The third capacitor electrode Cst3 is integrally formed with the power line PL. The third capacitor electrode Cst3 is extended in a direction crossing the power line PL, and thus, forms a lattice, from a plan view. At least one lattice created by the crossing of the third capacitor electrode Cst3 and the power line PL may be included in the display device. The third capacitor electrode Cst3 is continuously extended in a direction crossing the first and second data lines DL1 and DL2. Accordingly, the third capacitor electrode Cst3 may cross a plurality of other data lines, in addition to the first and second data lines DL1 and DL2. For example, the first and second sub data lines DLsub1 and DLsub2 may be crossed by the third capacitor electrode Cst3. However, since the first and second sub data lines DLsub1 and DLsub2 are crossed by the third capacitor electrode Cst3, the first and second sub data lines DLsub1 and DLsub2 are provided on a different layer from that of the third capacitor electrode Cst3. Accordingly, the third capacitor electrode Cst3 and the first and second data lines DL1 and DL2 are not connected with one another even though the third capacitor electrode Cst3 crosses the first and second data lines DL1 and DL2. The third capacitor electrode Cst3 has a curved form corresponding to the shape of the third projected portion GR3 of the second interlayer insulating layer. The reason is that the third capacitor electrode Cst3 is disposed on the second interlayer insulating layer IL2 along the curve of the third projected portion GR3. Accordingly, the third capacitor electrode Cst3 may also have a shape that extends in the first direction or the second direction. In addition, the third capacitor electrode Cst3 may have an embossed form, similar to the third projected portion GR3 of the second interlayer insulating layer IL2.

The second capacitor electrode Cst2 and the third capacitor electrode Cst3 each have the curved shapes, so that the area of the overlapping region between the second capacitor electrode Cst2 and the third capacitor electrode Cst3 is increased. Thus, the charging capacity of the capacitor Cst may be increased, and will follow the description related to FIG. 4.

A passivation layer PSV including an opening OPN is provided on the bridge pattern BRP. The opening OPN exposes at least a part of the bridge pattern BRP. An anode AD of the organic light emitting diode OLED is disposed on the passivation layer PSV, and the anode AD and the bridge pattern BRP are electrically connected to each other through the opening OPN. A pixel defining layer PDL and an emission layer EML are provided on the anode AD. A cathode CD of the organic light emitting diode OLED is provided on the emission layer EML. The anode AD, the emission layer EML, and the cathode CD form the organic light emitting diode OLED. A sealing layer SLM covering the cathode CD is provided on the cathode CD.

In an exemplary embodiment of the present invention, a gate insulating layer GI including at least one first projected portion GR1, and a first capacitor electrode Cst1, which may be provided on the gate insulating layer GI and on the same layer as that of a gate electrode (e.g., GE1 and GE2) of a transistor of the display device, may be above the semiconductor layers ACT1 to ACT6. In this case, an area of the second capacitor electrode Cst2, disposed above the first capacitor electrode Cst1, may be larger than an area of the first capacitor electrode Cst1.

Figure 8:
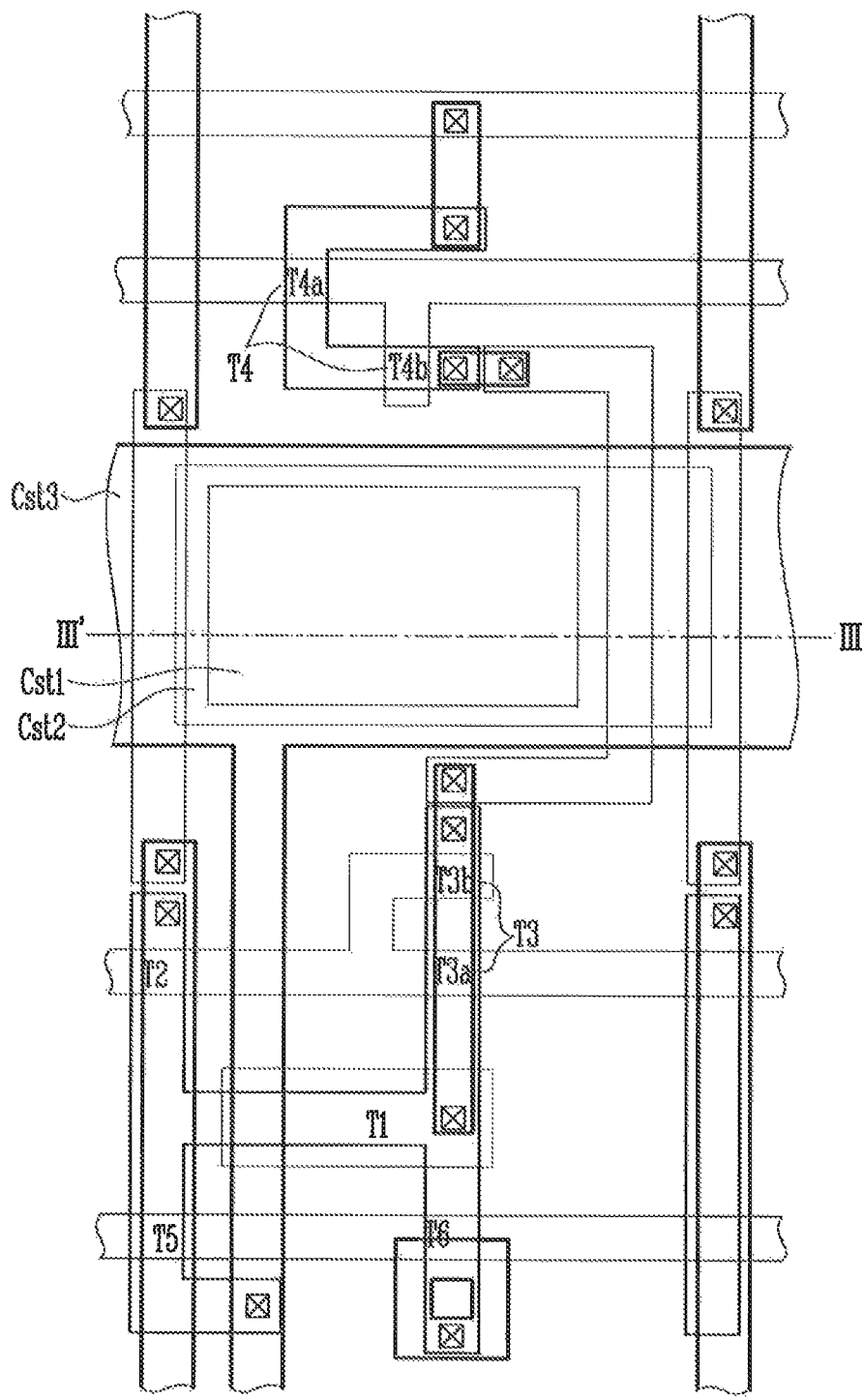
FIG. 8 is a top plan view illustrating a display device according to an exemplary embodiment of the present invention.
Figure 9:
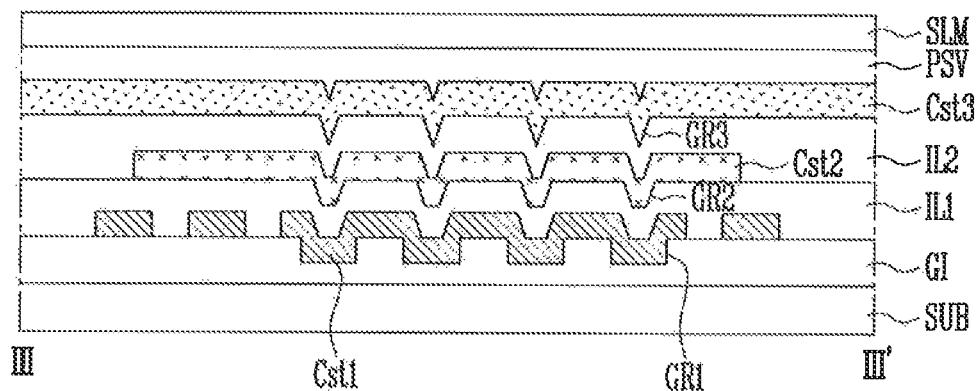
FIG. 9 is a cross-sectional view taken along line III-III' of FIG. 8.

FIG. 8 is a top plan view illustrating a display device according to an exemplary embodiment of the present invention. FIG. 9 is a cross-sectional view taken along line III-III' of FIG. 8. Hereinafter, a display device according to an exemplary embodiment of the present invention will be described with reference to FIGS. 8 and 9.

According to FIGS. 8 and 9, the display device according to the exemplary embodiment of the present invention includes a first capacitor electrode Cst1, a second capacitor electrode Cst2, and a third capacitor electrode Cst3. The first capacitor electrode Cst1, the second capacitor electrode Cst2, and the third capacitor electrode Cst3 overlap each other, from a plan view. Further, an area of the third capacitor electrode Cst3 is larger than an area of the second capacitor electrode Cst2, and the area of the second capacitor electrode Cst2 is larger than an area of the first capacitor electrode Cst1. A gate insulating layer GI includes a first projected portion GR1. A first interlayer insulating layer IL1 includes a second projected portion GR2. A second interlayer insulating layer IL2 includes a third projected portion GR3. The first capacitor electrode Cst1, the second capacitor electrode Cst2, and the third capacitor electrode Cst3 are curved or disposed so as to correspond to the shapes of the first projected portion GR1, the second projected portion GR2, and the third projected portion GR3, respectively. A capacitance may be formed by the first capacitor electrode Cst1, the second capacitor electrode Cst2, and the third capacitor electrode Cst3. According to the described structure, a large charging capacity may be obtained while decreasing a space occupied by the first capacitor electrode Cst1, the second capacitor electrode Cst2, and the third capacitor electrode Cst3.

Figure 10:
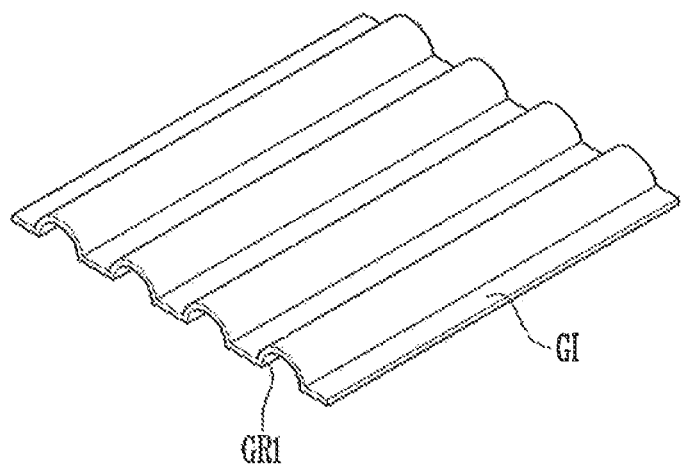
FIG. 10 is a perspective view illustrating a gate insulating layer according to an exemplary embodiment of the present invention.
Figure 11:
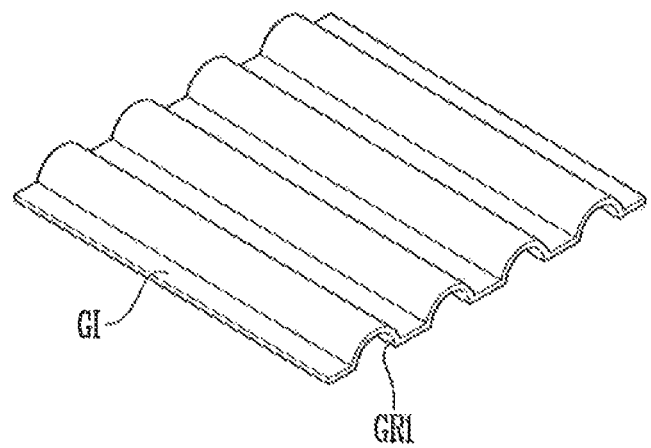
FIG. 11 is a perspective view illustrating a gate insulating layer according to an exemplary embodiment of the present invention.
Figure 12:
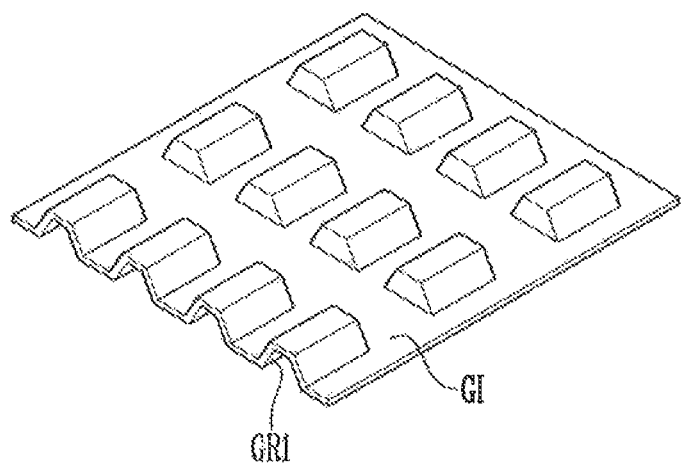
FIG. 12 is a perspective view illustrating a gate insulating layer according to an exemplary embodiment of the present invention.

FIGS. 10 to 12 are perspective views illustrating a gate insulating layer GI according to an exemplary embodiment of the present invention. The projected portions according to exemplary embodiments of the present invention may be provided in various forms as illustrated in FIGS. 10 to 12. Referring to FIGS. 10 to 12, the first, second, and third projected portions GR1, GR2, and GR3 may have a form extended in a first direction, a form extended in a second direction, or an embossed form. In addition, the gate insulating layer GI may have a plurality of first projected portions GR1 arranged adjacent to each other and extending in a same direction on the gate insulating layer GI. Further, the first projected portions GR1 may be arranged on the gate insulating layer GI with a predetermined interval between each of the first projected portions GR1. For example, the first projected portions GR1 may be arranged in columns and/or rows on the gate insulating layer GI. The first projected portion GR1 may have a semi-cylindrical shape or a trapezoidal shape as illustrated in FIGS. 10 to 12. However, the forms of the projected portions GR1, GR2, and GR3 are not limited to the illustrated forms. The number of projected portions may be one, two or more. For example, the first direction may be parallel or might not be parallel to an extension direction of a scan line. Further, the second direction may be parallel or might not be parallel to an extension direction of a data line. The projected portions GR1, GR2, and GR3 may be provided throughout the insulating layers (e.g., GI, IL1, and IL2) with a predetermined interval between each of the projected portions GR1, GR2, and GR3. Alternatively, the projected portions GR1, GR2, and GR3 may be provided in a specific region of the insulating layers (e.g., GI, IL1, and IL2).

The display device according to an exemplary embodiment of the present invention may be applied to various electronic devices. For example, the display device may be applied to a television, tablet computer, a personal computer, a notebook computer, a mobile phone, a smart phone, a smart pad, a Portable Multimedia Player (PDP), a Personal Digital Assistant (PDA), a navigation device, various wearable devices, such as a smart watch, and the like.

While the present invention has been described with reference to exemplary embodiments thereof, it will be understood by those of ordinary skill in the art that various changes in form and details may be made thereto without departing from the spirit and scope of the present invention as defined by the following claims.

What is claimed is:

1. A display device, comprising:
   a substrate;
   a semiconductor layer provided on the substrate;
   a gate insulating layer provided on the semiconductor layer and having one or more first projected portions;
   a gate electrode provided on the gate insulating layer;
   a first capacitor electrode provided on the gate insulating layer and provided on the same layer as the layer of the gate electrode;
   a first interlayer insulating layer provided on the gate electrode and the first capacitor electrode, and having one or more second projected portions;
   a second capacitor electrode provided on the first interlayer insulating layer;
   a source electrode and a drain electrode provided on the substrate, and electrically connected with the semiconductor layer; and a light emitting diode connected with the drain electrode,
wherein the first capacitor electrode is curved so as to correspond to a shape of the first projected portions, and the second capacitor electrode is curved so as to correspond to a shape of the second projected portions, wherein the shape of the first projected portions is different from the shape of the second projected portions.

2. The display device of claim 1, further comprising:
a second interlayer insulating layer provided on the second capacitor electrode and having one or more third projected portions; and
a third capacitor electrode provided on the second interlayer insulating layer, and provided on the same layer as the layers of the source electrode and the drain electrode.

3. The display device of claim 2, wherein an area of the third capacitor electrode is larger than an area of the second capacitor electrode.

4. The display device of claim 1, wherein the first projected portions and the second projected portions overlap each other, from a plan view.

5. The display device of claim 1, wherein the second capacitor electrode covers the first capacitor electrode, from a plan view.

6. The display device of claim 1, wherein an area of the second capacitor electrode is larger than an area of the first capacitor electrode.

7. The display device of claim 1, further comprising:
a plurality of data lines connected with the source electrode, and parallel to one another,
wherein the second capacitor electrode is extended such that the second capacitor electrode crosses the plurality of data lines.

8. The display device of claim 1, further comprising:
a power line provided on the same layer as the layers of the source electrode and the drain electrode, and connected with the second capacitor electrode to apply a fixed voltage to the second capacitor electrode.

9. The display device of claim 1, wherein the first projected portions extend in a first direction or a second direction, the second direction being substantially perpendicular to the first direction.

10. A display device, comprising:
a substrate;
a semiconductor layer provided on the substrate;
a gate electrode provided on the semiconductor layer;
a first interlayer insulating layer provided on the gate electrode and having one or more of second projected portions;
a second capacitor electrode provided on the first interlayer insulating layer;
a second interlayer insulating layer provided on the second capacitor electrode and having one or more of third projected portions;
a source electrode and a drain electrode provided on the substrate, and electrically connected with the semiconductor layer;
a third capacitor electrode provided on the second interlayer insulating layer; and
a light emitting diode connected with the drain electrode,
wherein the second capacitor electrode includes one or more second protrusions overlapping the second projected portions, and the third capacitor electrode includes one or more third protrusions overlapping the third projected portions, wherein a shape of the one or more second protrusions is different from that of the one or more third protrusions.

11. The display device of claim 10, further comprising:
a gate insulating layer provided on the semiconductor layer and having one or more of first projected portions; and
a first capacitor electrode provided on the gate insulating layer, and provided on the same layer as the layer of the gate electrode.

12. The display device of claim 10, wherein the third capacitor electrode covers the second capacitor electrode, from a plan view.

13. The display device of claim 10, wherein the second projected portions and the third projected portions overlap, from a plan view.

14. The display device of claim 10, wherein an area of the third capacitor electrode is larger than an area of the second capacitor electrode.

15. The display device of claim 11, wherein an area of the second capacitor electrode is larger than an area of the first capacitor electrode.

16. The display device of claim 10, further comprising:
a plurality of data lines connected with the source electrode, and parallel to one another,
wherein the third capacitor electrode is extended so as to cross the plurality of data lines.

17. The display device of claim 10, further comprising:
a power line provided on the same layer as the layers of the source electrode and the drain electrode, and integrally formed with the third capacitor electrode.

18. The display device of claim 17, wherein the power line and the third capacitor electrode cross each other and form a lattice.

19. The display device of claim 10, wherein the second projected portions and the third projected portions have forms extend in a first direction or a second direction, the second direction being substantially perpendicular to the first direction.

20. The display device of claim 10, wherein the second capacitor electrode is separated from other elements within the display device.

* * * * *